(12) United States Patent
Levinski et al.

(10) Patent No.: US 11,614,692 B2
(45) Date of Patent: Mar. 28, 2023

(54) SELF-MOIRE GRATING DESIGN FOR USE IN METROLOGY

(71) Applicant: KLA Corporation, Milpitas, CA (US)

(72) Inventors: Vladimir Levinski, Migdal HaEmek (IL); Yoel Feler, Haifa (IL)

(73) Assignee: KLA Corporation, Milpitas, CA (US)

(*) Notice: Subject to any disclaimer, the term of this patent is extended or adjusted under 35 U.S.C. 154(b) by 334 days.

(21) Appl. No.: 16/758,908

(22) PCT Filed: Mar. 20, 2020

(86) PCT No.: PCT/US2020/023741
§ 371 (c)(1),
(2) Date: Apr. 24, 2020

(87) PCT Pub. No.: WO2020/197950
PCT Pub. Date: Oct. 1, 2020

(65) Prior Publication Data
US 2021/0200106 A1 Jul. 1, 2021

Related U.S. Application Data

(60) Provisional application No. 62/823,342, filed on Mar. 25, 2019.

(51) Int. Cl.
*G03F 7/20* (2006.01)
*G02B 27/60* (2006.01)

(52) U.S. Cl.
CPC ......... *G03F 7/70683* (2013.01); *G02B 27/60* (2013.01); *G03F 7/70633* (2013.01)

(58) Field of Classification Search
CPC ............ G03F 7/70683; G03F 7/70633; G03F 7/70616; G02B 27/60; G01B 11/02; G01B 11/25
See application file for complete search history.

(56) References Cited

U.S. PATENT DOCUMENTS

| | | |
|---|---|---|
| 6,351,307 B1 | 2/2002 | Erskine |
| 7,440,105 B2 | 10/2008 | Adel et al. |
| 9,864,209 B2 | 1/2018 | Levinski et al. |

(Continued)

OTHER PUBLICATIONS

Ausschnitt, "From compliance to control: off-roadmap metrology for low k-1 lithography," Proc. SPIE 4344, Metrology, Inspection, and Process Control for Microlithography XV, Aug. 22, 2001.

(Continued)

*Primary Examiner* — Robert E. Tallman
(74) *Attorney, Agent, or Firm* — Hodgson Russ LLP

(57) ABSTRACT

A grating for use in metrology including a periodic structure including a plurality of units having a pitch P, at least one unit of the plurality of units including at least a first periodic sub-structure having a first sub-pitch P1 smaller than the pitch P, and at least a second periodic sub-structure arranged along-side and separated from the first periodic sub-structure within the at least one unit and having a second sub-pitch P2 smaller than the pitch P and different from the first sub-pitch P1, P1 and P2 being selected to yield at least one Moir pitch $P_m = P1 \cdot P2/(P2-P1)$, the pitch P being an integer multiple of the first sub-pitch P and of the second sub-pitch P2.

20 Claims, 5 Drawing Sheets

(56) References Cited

U.S. PATENT DOCUMENTS

| | | |
|---|---|---|
| 10,101,592 B2 | 10/2018 | Levinski et al. |
| 2005/0123844 A1 | 6/2005 | Monshouwer |
| 2005/0173634 A1 | 8/2005 | Wong et al. |
| 2006/0250597 A1 | 11/2006 | Nakajima |
| 2012/0133938 A1 | 5/2012 | Deckers et al. |
| 2015/0233818 A1 | 8/2015 | Manassen |
| 2016/0216197 A1* | 7/2016 | Bringoltz et al. |
| 2017/0146810 A1* | 5/2017 | Levinski ............ G03F 7/70616 |

OTHER PUBLICATIONS

WIPO, ISR for PCT/US2020/023741, Jul. 10, 2020.
EPO, European Search Report and Opinion for EP Application No. 20778397.8, dated Oct. 25, 2022.

* cited by examiner

SELF-MOIRE GRATING DESIGN FOR USE IN METROLOGY

REFERENCE TO RELATED APPLICATIONS

Reference is hereby made to U.S. Provisional Patent Application Ser. No. 62/823,342, filed Mar. 25, 2019 and entitled NEW APPROACH FOR SELF-MOIRÉ TARGET DESIGN FOR OVL MEASUREMENT, the disclosure of which is hereby incorporated by reference and priority of which is hereby claimed.

Reference is also made to the following patents related to the subject matter of the present invention, the disclosures of which are hereby incorporated by reference:

U.S. Pat. Nos. 9,864,209 and 10,101,592, both entitled SELF-MOIRE TARGET DESIGN PRINCIPLES FOR MEASURING UNRESOLVED DEVICE-LIKE PITCHES, respectively filed May 19, 2016 and Dec. 1, 2017, assigned to the same assignee as the present invention.

FIELD OF THE INVENTION

The present invention relates generally to metrology and more particularly to gratings for use in metrology.

BACKGROUND OF THE INVENTION

Various types of gratings for use in metrology are known in the art.

SUMMARY OF THE INVENTION

The present invention seeks to provide novel, readily printable gratings for use in metrology targets for providing highly accurate measurements.

There is thus provided in accordance with a preferred embodiment of the present invention a grating for use in metrology including a periodic structure including a plurality of units having a pitch P, at least one unit of the plurality of units including at least a first periodic sub-structure having a first sub-pitch P1 smaller than the pitch P, and at least a second periodic sub-structure arranged along-side and separated from the first periodic sub-structure within the at least one unit and having a second sub-pitch P2 smaller than the pitch P and different from the first sub-pitch P1, P1 and P2 being selected to yield at least one Moiré pitch $P_m=P1 \cdot P2/(P2-P1)$, the pitch P being an integer multiple of the first sub-pitch P1 and of the second sub-pitch P2.

Preferably, P1 and P2 are semiconductor device-like pitches.

In accordance with a preferred embodiment of the present invention, $P/P_m$ is substantially equal to 1.

Alternatively, $P/P_m$ is substantially equal to 2.

Preferably, P≥200 nm. Additionally preferably, P1 and P2<200 nm.

Preferably, the first and second periodic sub-structures lie along a common axis, P1 and P2 being defined along the common axis.

Preferably, there is also provided a metrology target for measurement of misregistration between layers of a semiconductor device, the target including at least two gratings, at least one of the at least two gratings including the grating of a preferred embodiment of the present invention, the at least two gratings being arranged in a mutually layered configuration.

Preferably, the at least two gratings have the same Moiré pitch.

Alternatively, the at least two gratings have mutually different Moiré pitches.

There is additionally provided in accordance with another preferred embodiment of the present invention a method for forming a grating for use in metrology including providing a periodic structure including a plurality of units having a pitch P, at least one unit of the plurality of units including at least a first periodic sub-structure having a first sub-pitch P1 smaller than the pitch P, and at least a second periodic sub-structure arranged along-side and separated from the first periodic sub-structure within the at least one unit and having a second sub-pitch P2 smaller than the pitch P and different from the first sub-pitch P1, P1 and P2 being selected to yield at least one Moiré pitch $P_m=P1 \cdot P2/(P2-P1)$, the pitch P being an integer multiple of the first sub-pitch P1 and of the second sub-pitch P2.

In accordance with a preferred embodiment of the method of the present invention, P1 and P2 are semiconductor device-like pitches.

Preferably, $P/P_m$ is substantially equal to 1. Alternatively, $P/P_m$ is substantially equal to 2.

Preferably, P≥200 nm. Additionally preferably, P1 and P2<200 nm.

Preferably, the method also includes arranging the first and second periodic sub-structures to lie along a common axis, P1 and P2 being defined along the common axis.

Preferably, the method additionally includes arranging at least two gratings in a mutually layered configuration so as to form a metrology target for measurement of misregistration between layers of a semiconductor device, at least one of the at least two gratings including the grating provided by the method of the present invention.

Preferably, the at least two gratings have the same Moiré pitch.

Alternatively, the at least two gratings have mutually different Moiré pitches.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
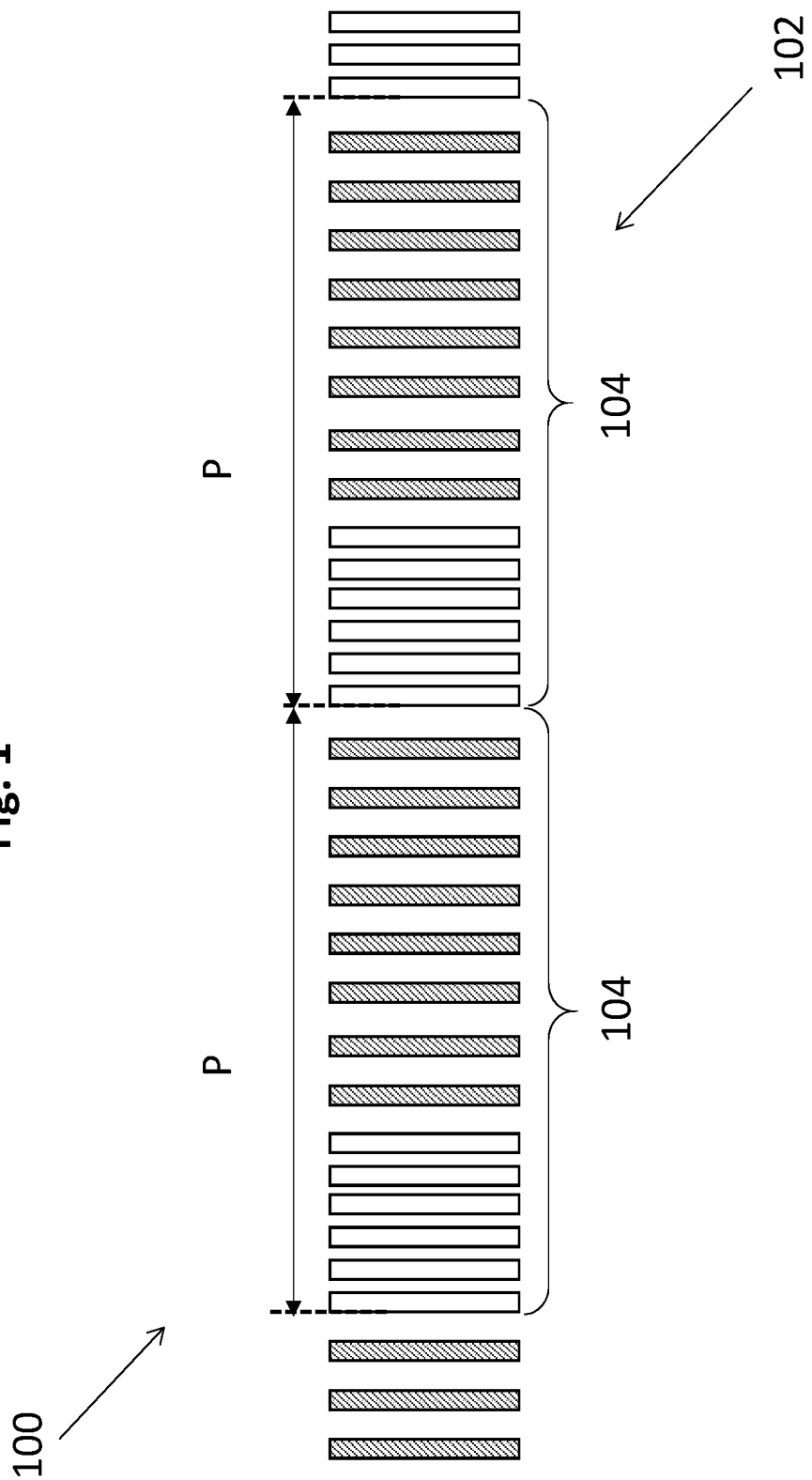
FIG. 1 is a simplified schematic top view illustration of a grating useful in metrology measurements, constructed and operative in accordance with a preferred embodiment of the present invention.
Figure 2:
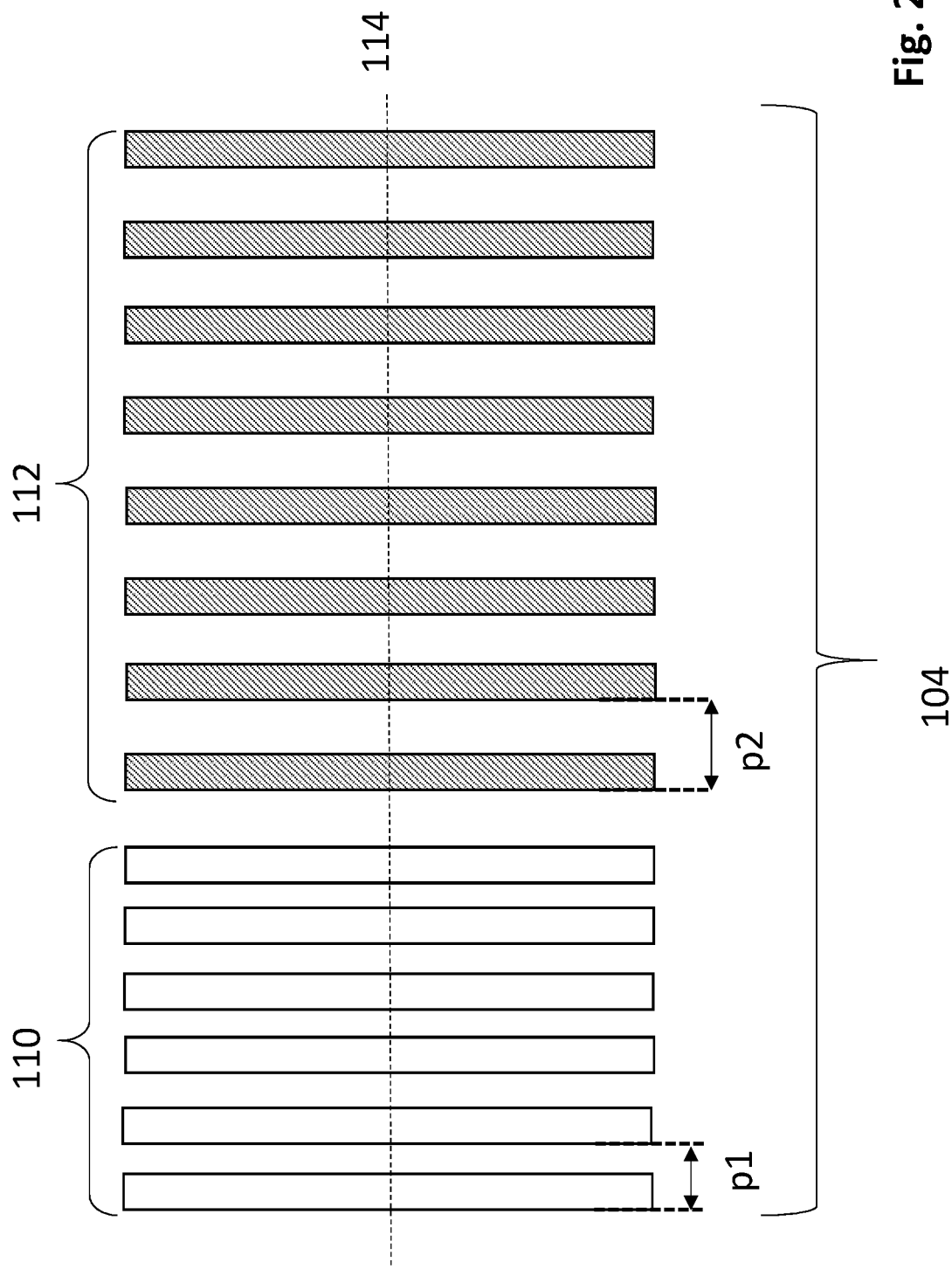
FIG. 2 is a simplified schematic top view illustration of a unit forming part of a grating of the type shown in FIG. 1.

Reference is now made to FIG. 1, which is a simplified schematic top view illustration of a grating useful in metrology measurements and to FIG. 2, which is a simplified schematic top view illustration of a unit forming part of a grating of the type shown in FIG. 1, constructed and operative in accordance with a preferred embodiment of the present invention.

As seen in FIGS. 1 and 2, there is provided a grating 100 comprising a periodic patterned structure 102 formed by a plurality of repeating units 104. Here, by way of example, a portion of grating 100 is shown including two complete units 104 shown to be mutually identical. Grating 100 is preferably adapted for formation on a semiconductor device, in order to facilitate metrology measurements relating to the device based on measurements obtained from the grating formed thereon. Such metrology measurements may include imaging measurements, Moire interference based measurements, scatterometry based measurements or other types of measurements. It is appreciated that such measurements are performed on structures such as grating 100, rather than directly with respect to the device itself, since the design rule pitch of the device is typically of a scale that is unresolved by optical measurement tools. Particularly preferably, grating 100 may be incorporated in a target comprising multiple layers of gratings and used for the measurement of misregistration between layers in the manufacture of semiconductor devices, as is further detailed hereinbelow with reference to FIGS. 3 and 4.

Units 104 preferably form periodic structure 102 having a pitch P. Pitch P is preferably of a magnitude so as to be resolvable by standard optical measurement tools, such as, by way of example only, Archer family tools commercially available from KLA Corporation of California, USA, for example A700 and ATL100. By way of example, pitch P may be of the order of several hundred or several thousand nanometers. In accordance with one preferred embodiment of the present invention, pitch P may be in the range of 200-4500 nm. In accordance with another preferred embodiment of the present invention, pitch P may in the range of 1200-2500 nm. It is appreciated that such a pitch is typically much larger than the pitch of the device design rule of the semiconductor device upon which grating 100 is formed.

As seen most clearly in FIG. 2, at least one unit of units 104 comprises at least a first periodic sub-structure 110 and at least a second periodic sub-structure 112 aligned therewith. Here, by way of example, each of units 104 of grating 100 is shown to comprise therewithin first periodic sub-structure 110 and second periodic sub-structure 112. First and second periodic sub-structures 110 and 112 are preferably arranged in a side-by-side configuration along a common axis 114 so as to combinedly extend along substantially an entirety of unit 104, thus defining unit 104. First and second periodic sub-structures 110 and 112 are preferably arranged side-by-side in a mutually separated, non-interlaced or overlapping configuration.

First periodic sub-structure 110 preferably has a first sub-pitch P1 and second periodic sub-structure 112 preferably has a second sub-pitch P2, different from P1. Sub-pitches P1 and P2 are preferably much smaller than pitch P and particularly preferably are device-like pitches, meaning that pitches P1 and P2 are preferably of the same order of magnitude as the device design rule pitch of the semiconductor device with which grating 100 is used in conjunction. By way of example, P1 and P2 may be between 10 nm to less than 200 nm. As explained hereinabove, due to their similarity in size to device design rule pitches, first and second sub-pitches P1 and P2 are in themselves directly unresolved by optical tools. However, first and second sub-pitches P1 and P2 are preferably selected so as to yield at least one Moiré pitch $P_m$ in accordance with:

$$P_m = P1 \cdot P2/(P2-P1) \quad (1)$$

which Moiré pitch $P_m$ is preferably measurable and resolvable by optical tools. Thus, notwithstanding sub-pitches P1 and P2 being so small as to be unmeasurable by optical tools, these pitches combinedly yield a Moiré pitch which is measurable and based on signals from which information may be obtained.

In accordance with a particularly preferred embodiment of the present invention P, P1 and P2 are selected such that the pitch P of pattern 102 is an integer multiple of P1, of P2 and of the Moiré pitch $P_m$ yielded by a combination of the sub-pitches P1 and P2 of substructures 110 and 112 respectively within pattern 102, as defined by equation (1). It has been found by the present inventors that when the relationship P/P1 and P/$P_m$ being equal to an integer is satisfied, the condition P/P2 being equal to an integer is satisfied within the layer defined by pattern 102 when two evanescent modes with pitches P1 and P2 are generated by scattering on first and second sub-structures 110 and 112. These modes are evanescent outside of the layer defined by pattern 102. However, the amplitude of the two modes within the layer may be comparable to the amplitude of the zero order propagated electrical field, such that the electrical field E within the layer defined by pattern 102 due to sub-pitches P1 and P2 within pattern 102 may be described in accordance with $$E = const_1 + a_1 \cdot e^{i\frac{2\pi}{P1}x} + a_{-1} \cdot e^{-i\frac{2\pi}{P1}x} + b_1 \cdot e^{i\frac{2\pi}{P2}x} + b_{-1} \cdot e^{-i\frac{2\pi}{P2}x} \ldots \quad (2)$$

where $a_1$ and $b_1$ are amplitude coefficients respectively associated with P1 and P2.

Based on this, the re-scattering of modes generated by first substructure 110 having first sub-pitch P1 with respect to second substructure 112 having second sub-pitch P2 and vice-versa provides a 'self-Moiré' mode with diffraction orders propagating throughout the target and having a Moiré pitch as described by equation (1) and an amplitude proportional to $a_1 \cdot b_{-1}$ and $a_{-1} \cdot b_1$. This amplitude may be of an order of magnitude comparable to the amplitude of the zeroth order electric field. The Moiré pitch yielded is measurable and resolved by optical tools, such that measurements relating to misregistration of a semiconductor device may be performed using a target including grating 100, despite the pitch of the sub-structures 110 and 112 forming pattern 102 of grating 100 being unresolved.

The provision, in accordance with preferred embodiments of the present invention, of a grating comprising unresolved periodic structures having device-like pitches of the order of magnitude of the device design rule pitch, but which device-like pitches give rise to a resolved and measurable Moiré pitch is highly advantageous. The device-like pitch of the grating sub-structures leads to an improvement in accuracy of metrology measurements and provides metrology measurement values more relevant to real devices than those values obtained based on targets having pitches of orders of magnitude that are considerably greater than those of the device design rule.

It is a particular advantage of a preferred embodiment of the present invention that at least first and second sub-structures 110 and 112 may be arranged in a simple side-by-side configuration and preferably a co-linear configuration, in which first and second sub-structures 110 and 112 are mutually separated and non-interlaced or overlapping, so as to define the longitudinal extent of unit 104 of pattern 102. This arrangement is based on the finding by the present inventors, as detailed hereinabove, that evanescent modes undergoing double scattering to yield a Moiré mode are generated in the case that the pitch P of pattern 102 is an integer multiple of both first and second sub-pitches of sub-structures 110 and 112 therewithin. The linear arrangement of first and second sub-structures 110 and 112 to form unit 104 is readily printable and does not include large inter-feature gaps, leading to better process compatibility and accuracy. Furthermore, efficient re-scattering occurs between first and second sub-structures 110 and 112, thus giving rise to a Moiré mode measurable by conventional optical tools known in the art.

It is appreciated that pitches P, P1 and P2 are not shown to scale in FIGS. 1 and 2 and are illustrated in a highly schematic, representative manner in order to clearly differentiate between the scales of the various different pitches.

Furthermore, it is appreciated that the present invention is not limited to the inclusion of only two sub-structures within each unit, such as sub-structures 110 and 112 shown herein. Rather, a greater number of sub-structures may be included within each unit of the overall pattern 102, provided that the pitches of the each of the substructures satisfy the requirement that the pitch of pattern 102 is an integer multiple of the sub-pitches of each of the periodic sub-structures therewithin.

Preferably, grating 100 may be designed by dividing the pitch P of each unit 104 of pattern 102 into two parts. Preferably, for ease of analysis of the signal arising from grating 100 when optical measurements are performed thereon, pitch P of unit 104 is divided into two equal parts. However, pitch P may be divided into more than two parts, which two or more parts may be non-equal, depending on the nature of the particular measurements to be performed on grating 100.

First and second sub-structures 110 and 112 are preferably respectively located symmetrically within each of the divided parts of unit 104 having pitch P. The center of first sub-structure 110 and the center of second sub-structure 112 form first and second centers of symmetry in unit 104. In order that the center of symmetry of the signal arising from grating 100 when optical measurements are performed thereon corresponds to one of the centers of symmetry of first and second sub-structures 110 and 112, it is preferable that $P/P_m$ is set to equal to 1 or 2. This simplifies analysis of the signal and reduces ambiguity therein. However, it is appreciated that in certain embodiments of the present invention, $P/P_m$ may be equal to integers greater than 2.

By way of example, P1 may be set to be 90 nm, equal to a lithography design rule pitch. The required measured signal pitch is equal to the Moiré pitch given by equation (1), such that P2 may be set based on rearranging equation (1) to give:

$$P_2 = P_m \cdot P_1 / (P_m - P_1) \qquad (3)$$

and the pitch of the pattern 102 of grating 100 is preferably set in accordance with $P = P_m$ or $P = 2P_m$.

It is appreciated that multiple ones of the gratings of the present invention, such as grating 100, may be layered with respect to each other or with respect to other grating designs, in order to form targets useful for facilitating measurement of misregistration between various layers of semiconductor devices in the manufacture thereof.

Figure 3:
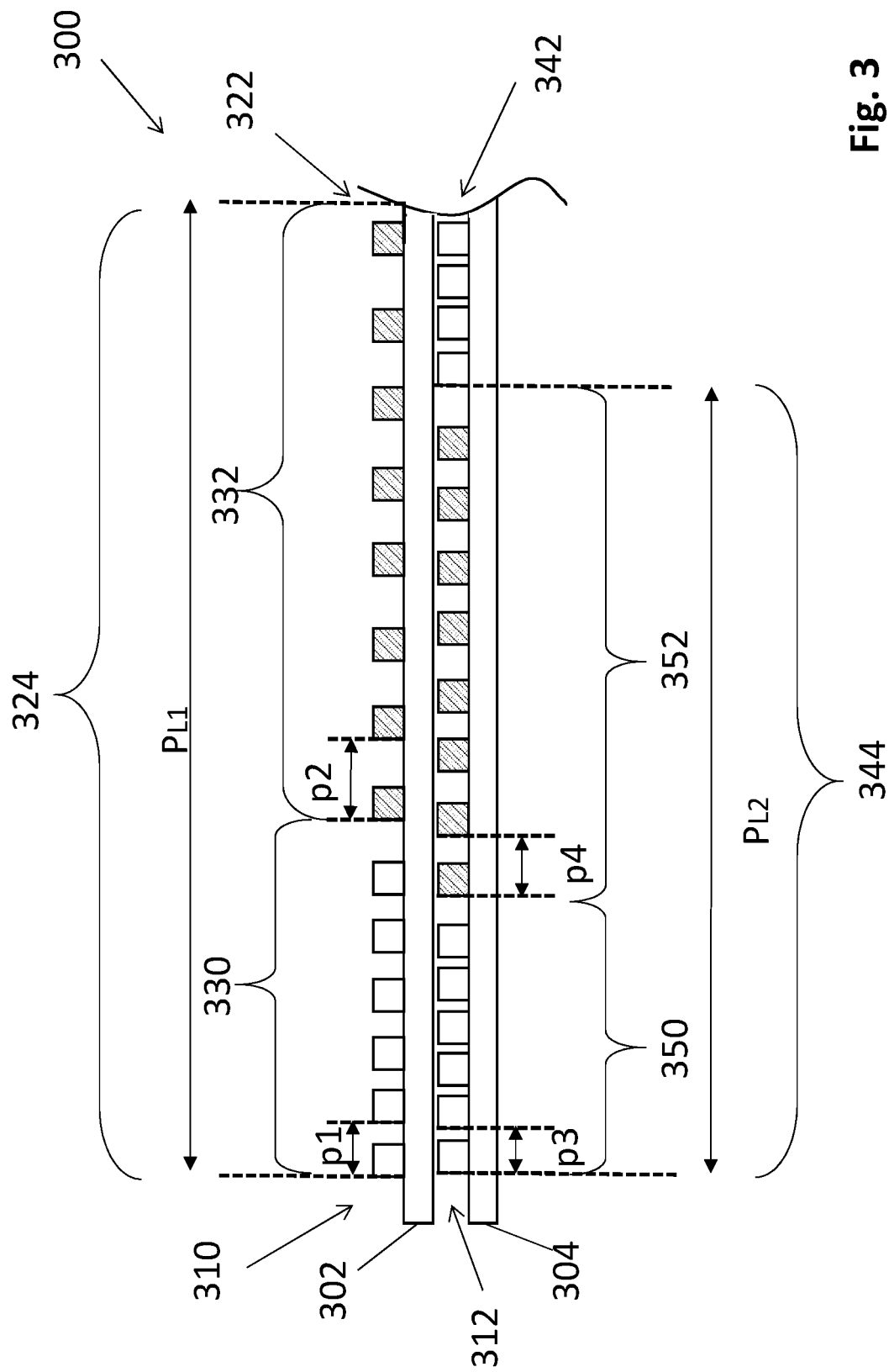
FIG. 3 is a simplified schematic side view illustration of a metrology target including mutually layered gratings constructed and operative in accordance with another preferred embodiment of the present invention.

Turning now to FIG. 3, an exemplary layered embodiment of a metrology target 300, constructed and operative in accordance with a preferred embodiment of the present invention, is shown. As seen in FIG. 3, layered target 300 may be formed on a first layer 302 and a second layer 304 of a semiconductor device. A first target layer 310, of a type generally resembling the design of grating 100, is preferably formed on first layer 302 and a second target layer 312, also of a type generally resembling the design of grating 100 but with different design parameters than those of first target layer 310, is preferably formed on second layer 304.

It is appreciated that the formation of layered target 300 by first and second layers of gratings each comprising a grating design resembling that of grating 100 is exemplary only and that target 300 may alternatively comprise one target layer comprising a grating design resembling that of grating 100 and another target layer comprising a grating design not resembling that of target 100, but rather a conventional periodic grating design, various types of which are well known to those skilled in the art.

First target layer 310 preferably comprises a periodic patterned structure 322 formed by a plurality of repeating units 324 having pitch $P_{L1}$. Here, by way of example, a portion of target 300 is shown including one complete unit 324. It is appreciated, however, that first target layer 310 may include a greater number of units, such as five or six units.

At least one unit of units 324 preferably comprises at least a first periodic sub-structure 330 and at least a second periodic sub-structure 332 aligned therewith. Here, by way of example, unit 324 is shown to comprise therewithin first periodic sub-structure 330 and second periodic sub-structure 332. First and second periodic sub-structures 330 and 332 are preferably arranged in a side-by-side configuration along a common axis so as to combinedly extend along substantially an entirety of unit 324, thus defining unit 324. First and second periodic sub-structures 330 and 332 are preferably arranged side-by-side in a mutually separated, non-interlaced or overlapping configuration.

First periodic sub-structure 330 preferably has a first sub-pitch P1 and second periodic sub-structure 332 preferably has a second sub-pitch P2, different from P1. Sub-pitches P1 and P2 are preferably much smaller than pitch $P_{L1}$ and particularly preferably are device-like pitches of the same order of magnitude as the device design rule pitch of the semiconductor device with which target 300 is used in conjunction. As explained hereinabove, due to their similarity in size to device design rule pitches, first and second pitches P1 and P2 are in themselves directly unresolvable by optical tools. However, pitch $P_{L1}$ and first and second pitches P1 and P2 are preferably selected so as to yield at least one first Moiré pitch $P_{m1}$ of pattern 322 in accordance with:

$$P_{m1} = P1 \cdot P2 / (P2 - P1) \qquad (4)$$

In this case, first Moiré pitch $P_{m1}$ may be of an order of magnitude so as not to be resolved by an optical system, such as, for example, under conditions of quasi-normal illumination and a numerical aperture of about 0.7. By way of example, first Moiré pitch $P_{m1}$ may be of the order of 500-600 nm. Alternatively, first Moiré pitch $P_{m1}$ may be of an order of magnitude as to give rise to a measurable Moiré pattern. In accordance with a particularly preferred embodiment of the present invention $P_{L1}$, P1 and P2 are preferably selected such that the pitch $P_{L1}$ of pattern 322 is an integer multiple of P1, of P2 and of the Moiré pitch $P_{m1}$ yielded by a combination of the pitches P1 and P2 of substructures 330 and 332 respectively within pattern 322, as defined by equation (4).

Second target layer 312 preferably comprises a periodic patterned structure 342 formed by a plurality of repeating units 344 having pitch $P_{L2}$ which is preferably different than pitch $P_{L1}$. Here, by way of example, a portion of target 300 is shown including one complete unit 344 and an incomplete portion of part of an adjacent unit 344. It is appreciated, however, that pattern 342 may include a greater number of units, such as five or six units.

At least one unit of units 344 preferably comprises at least a first periodic sub-structure 350 and at least a second periodic sub-structure 352 aligned therewith. Here, by way of example, unit 344 is shown to comprise therewithin first periodic sub-structure 350 and second periodic sub-structure 352. First and second periodic sub-structures 350 and 352 are preferably arranged in a side-by-side configuration along a common axis so as to combinedly extend along substantially an entirety of unit 344, thus defining unit 344. First and second periodic sub-structures 350 and 352 are preferably arranged side-by-side in a mutually separated, non-interlaced or overlapping configuration.

First periodic sub-structure 350 preferably has a third sub-pitch P3 and second periodic sub-structure 352 preferably has a fourth sub-pitch P4, different from P3. Pitches P3 and P4 are preferably much smaller than pitch $P_{L2}$ and particularly preferably are device-like pitches of the same order of magnitude as the device design rule pitch of the semiconductor device with which target 300 is used in conjunction. By way of example, P1, P2, P3 and P4 may be in the range of about 30 nm. As explained hereinabove, due to their similarity in size to device design rule pitches, third and fourth pitches P3 and P4 are in themselves directly unresolved by optical tools. However, pitch $P_{L2}$ and third and fourth pitches P3 and P4 are preferably selected so as to yield at least one second Moiré pitch $P_{m2}$ of pattern 342 in accordance with:

$$P_{m2}=P3 \cdot P4/(P4-P3) \quad (5)$$

In this case, second Moiré pitch $P_{m2}$ is different than first Moiré pitch $P_{m1}$ and may or may not be resolved by optical tools. In accordance with a particularly preferred embodiment of the present invention $P_{L2}$, P3 and P4 are preferably selected such that the pitch $P_{L2}$ of pattern 342 is an integer multiple of P3, of P4 and of the second Moiré pitch $P_{m2}$ yielded by a combination of the pitches P3 and P4 of substructures 350 and 352 respectively within pattern 342, as defined by equation (5).

Due to interaction between diffraction orders generated by the first and second target layers 310 and 312, the overall Moiré pitch $P_{mT}$ of layered target 300 is given by:

$$P_{mT}=P_{L1} \cdot P_{L2}/(P_{L1}-P_{L2}) \quad (6)$$

which overall Moiré pitch $P_{mT}$ is preferably measurable and resolvable by optical tools. Thus, notwithstanding pitches P1, P2, P3 and P4 being so small as to be unmeasurable by optical tools, these pitches combinedly yield a Moiré pitch which is measurable and based on signals from which information may be obtained relating to device misregistration.

The provision, in accordance with preferred embodiments of the present invention, of a layered target comprising at least one layer comprising unresolved periodic structures having device-like pitches of the order of magnitude of the device design rule pitch, but which device-like pitches give rise to a resolved and measurable overall Moiré pitch generated by the various target layers is highly advantageous. The device-like pitch of the target sub-structures leads to an improvement in accuracy of measurement of misregistration in manufacture of the device and provides misregistration values more relevant to real devices than those values obtained based on targets having pitches of orders of magnitude that are considerably greater than those of the device design rule.

It is a particular advantage of a preferred embodiment of the present invention that each of substructures 330 and 332 as well as 350 and 352 may be arranged in a simple side-by-side configuration and preferably a co-linear configuration, in which the sub-structures within each unit are mutually separated and non-interlaced or overlapping, so as to respectively define the longitudinal extent of the units of the patterns of each target layer of target 300. This arrangement is readily printable and does not include large inter-feature gaps, leading to better process compatibility and accuracy. Furthermore, efficient re-scattering occurs between first and second target layers 310 and 312, thus giving rise to a measurable Moiré mode measurable by conventional optical tools known in the art.

It is appreciated that pitches $P_{L1}$, $P_{L2}$, P1, P2, P3 and P4 are not shown to scale in FIG. 3 and rather are illustrated in a highly schematic, representative manner in order to clearly differentiate between the scales of the various different pitches.

Furthermore, it is appreciated that the present invention is not limited to the inclusion of only two layers, such as first and second layers 310 and 312, and may include additional layers depending on the design requirements of target 300.

Additionally, it is appreciated that since there is negligible interaction between the sub-substructures in first layer 310 and the sub-structures in second layer 312, these sub-structures may be arranged in any suitable spatial arrangement with respect to each other and need not be aligned as illustrated in FIG. 3.

It is understood that layered target 300 need not necessarily comprise layers with mutually differing Moiré pitches. In certain scatterometry-based metrology systems, it may be advantageous to implement a layered target generally resembling target 300 in certain aspects thereof, but wherein the Moiré pitches of the two or more layers are substantially equal. Additionally or alternatively, one of the layers may comprise a conventional periodic target having a pitch substantially equal to the Moiré pitch of another layer within the target.

Figure 4:
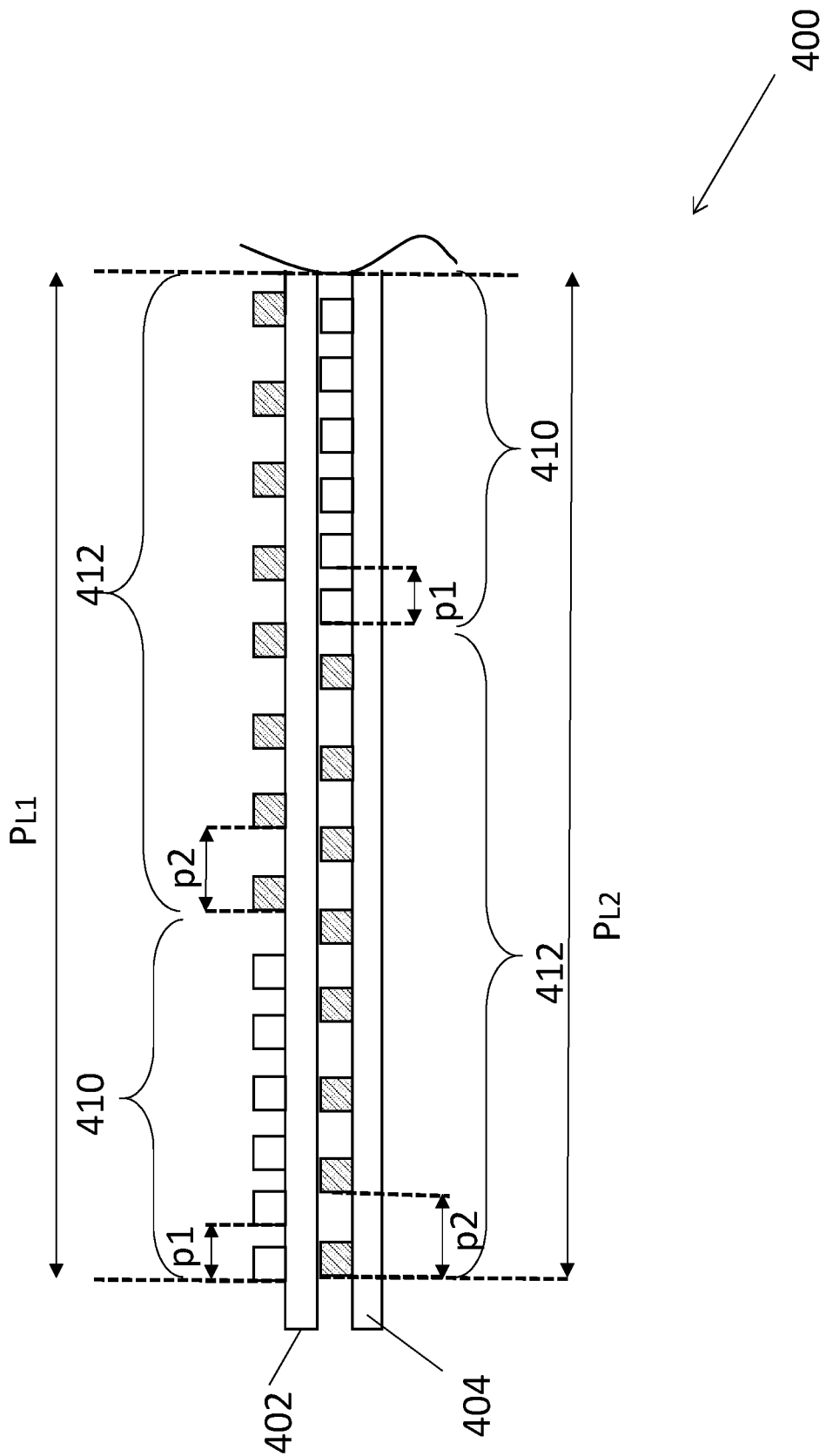
FIG. 4 is a simplified schematic side view illustration of a metrology target including mutually layered gratings, constructed and operative in accordance with yet another preferred embodiment of the present invention.

An example of such a target is shown in FIG. 4. Turning now to FIG. 4, an additional target 400, constructed and operative in accordance with a preferred embodiment of the present invention and particularly useful in scatterometry-based metrology systems, is illustrated. As seen in FIG. 4, layered target 400 may be formed on a first layer 402 and a second layer 404 of a semiconductor device. First layer 402 may comprise a plurality of repeating units have a pitch $P_{L1}$ and second layer 404 may comprise a plurality of repeating units have a pitch $P_{L2}$. Each of the repeating units within first layer 402 and second layer 404 may comprise a first sub-structure 410 having a first sub-pitch P1 and a second sub-structure 412 having a second sub-pitch P2. Here, by way of example, first and second sub-structures 410 and 412 are reversed with respect to each other in first layer 402 in comparison to second layer 404. However, it is appreciated that this is not necessarily the case.

Due to first and second layers 402 and 404 comprising the same sub-structures, albeit reversedly arranged with respect to each other, the Moiré pitches of the two layers are the same, rendering target 400 particularly useful in scatterometry-based metrology systems.

Figure 5:
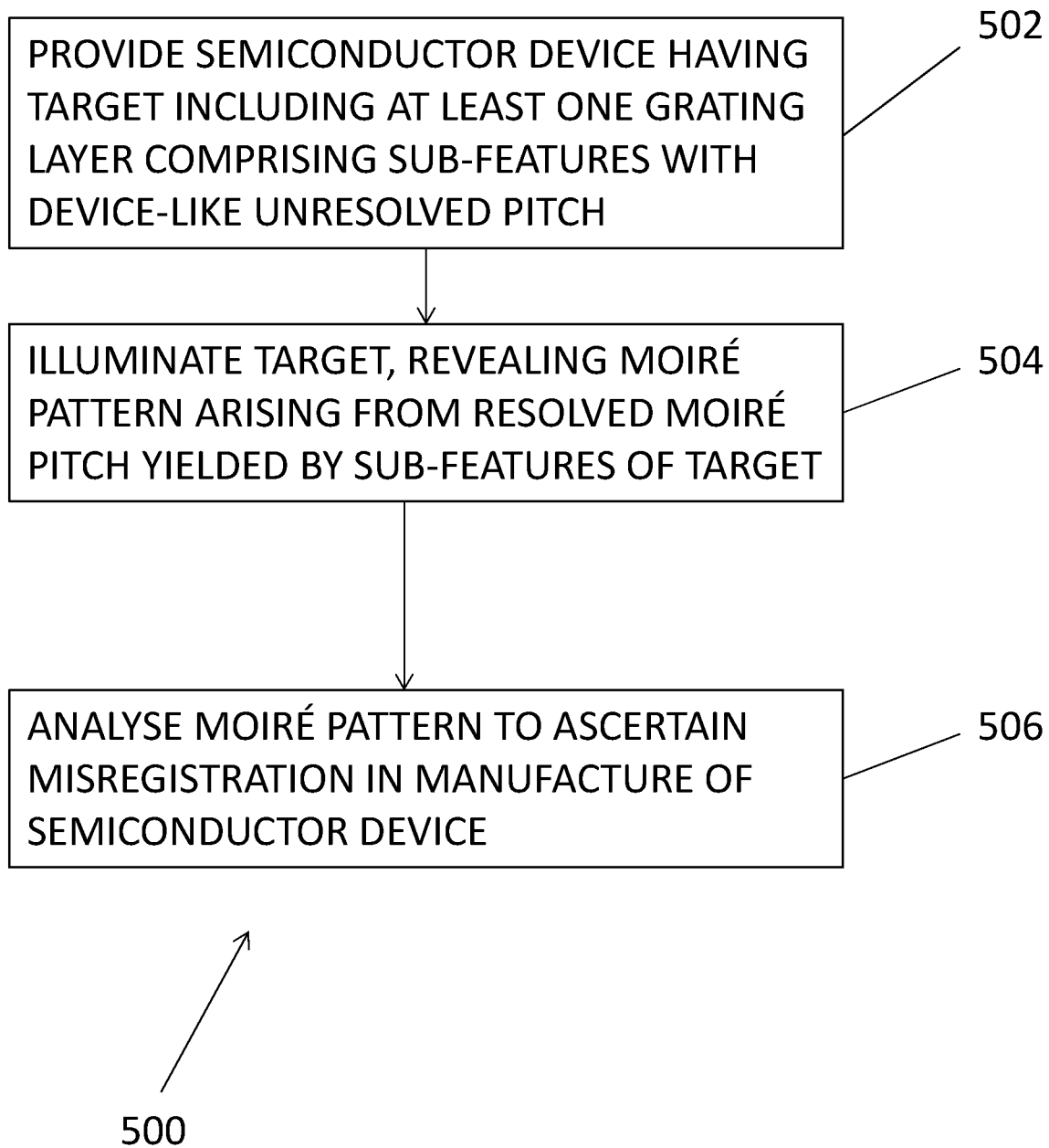
FIG. 5 is a simplified flowchart illustrating a metrology method using a grating of the type shown in any of FIGS. 1-4.

Reference is now made to FIG. 5, which is a simplified flowchart illustrating a method for measuring misregistration in the manufacture of semiconductor devices using a target comprising at least one of the gratings of any of FIGS. 1-4.

As seen in FIG. 5, a method 500 for measuring misregistration in the manufacture of semiconductor devices may begin at a first step 502, whereat a semiconductor device is provided having a target including at least one layer comprising a grating having sub-features with a device-like unresolved pitch. Particularly preferably, the grating layer comprises a repeating pattern having pitch P, each unit of the repeating pattern comprising at least two sub-structures having mutually different device-like pitches and being arranged in a side-by-side mutually separated configuration so as to define each unit. Preferably, the mutually different device-like pitches of the at least two sub-structures yield a Moiré pitch that is resolved by optical tools.

As seen at a second step 504, the target may then be illuminated, thereby revealing a Moiré pattern arising from a resolved Moiré pitch yielded by sub-features of the target.

As seen at a third step 506, the obtained Moiré pattern may subsequently be analyzed in order to derive information relating to misregistration in the semiconductor device within which the target is incorporated.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A grating for use in metrology comprising:
a periodic structure comprising a plurality of units having a pitch P, at least one unit of said plurality of units comprising:
at least a first periodic sub-structure having a first sub-pitch P1 smaller than said pitch P, and
at least a second periodic sub-structure arranged alongside, separated from, and non-interlaced with said first periodic sub-structure within said at least one unit and having a second sub-pitch P2 smaller than said pitch P and different from said first sub-pitch P1, P1 and P2 being selected to yield at least one Moiré pitch $P_m = P1 \cdot P2/(P2-P1)$, said pitch P being an integer multiple of said first sub-pitch P1 and of said second sub-pitch P2.

2. The grating according to claim 1, wherein P1 and P2 are semiconductor device-like pitches.

3. The grating according to claim 2, wherein $P/P_m$ is substantially equal to 1.

4. The grating according to claim 2, wherein $P/P_m$ is substantially equal to 2.

5. The grating according to claim 1, wherein P≥200 nm.

6. The grating according to claim 5, wherein P1 and P2<200 nm.

7. The grating according to claim 1, wherein said first and second periodic sub-structures lie along a common axis, P1 and P2 being defined along said common axis.

8. A metrology target for measurement of misregistration between layers of a semiconductor device, said target comprising at least two gratings, at least one of said at least two gratings comprising the grating of claim 1, said at least two gratings being arranged in a mutually layered configuration.

9. The metrology target according to claim 8, wherein said at least two gratings have the same Moiré pitch.

10. The metrology target according to claim 8, wherein said at least two gratings have mutually different Moiré pitches.

11. A method for forming a grating for use in metrology comprising:
providing a periodic structure comprising a plurality of units having a pitch P, at least one unit of said plurality of units comprising:
at least a first periodic sub-structure having a first sub-pitch P1 smaller than said pitch P, and
at least a second periodic sub-structure arranged alongside, separated from, and non-interlaced with said first periodic sub-structure within said at least one unit and having a second sub-pitch P2 smaller than said pitch P and different from said first sub-pitch P1, P1 and P2 being selected to yield at least one Moiré pitch $P_m = P1 \cdot P2/(P2-P1)$, said pitch P being an integer multiple of said first sub-pitch P1 and of said second sub-pitch P2.

12. The method according to claim 11, wherein P1 and P2 are semiconductor device-like pitches.

13. The method according to claim 12, wherein $P/P_m$ is substantially equal to 1.

14. The method according to claim 12, wherein $P/P_m$ is substantially equal to 2.

15. The method according to claim 11, wherein P≥200 nm.

16. The method according to claim 15, wherein P1 and P2<200 nm.

17. The method according to claim 11, and also comprising arranging said first and second periodic sub-structures to lie along a common axis, P1 and P2 being defined along said common axis.

18. The method according to claim 11, and also comprising arranging at least two gratings in a mutually layered configuration so as to form a metrology target for measurement of misregistration between layers of a semiconductor device, at least one of said at least two gratings comprising the grating of claim 11.

19. The method according to claim 18, wherein said at least two gratings have the same Moiré pitch.

20. The method according to claim 18, wherein said at least two gratings have mutually different Moiré pitches.

* * * * *